United States Patent [19]

Snyder

[11] Patent Number: 4,469,962
[45] Date of Patent: Sep. 4, 1984

[54] HIGH-SPEED MESFET CIRCUITS USING DEPLETION MODE MESFET SIGNAL TRANSMISSION GATES

[75] Inventor: David E. Snyder, Santa Monica, Calif.

[73] Assignee: Hughes Aircraft Company, El Segundo, Calif.

[21] Appl. No.: 315,334

[22] Filed: Oct. 26, 1981

[51] Int. Cl.³ ................ H03K 19/096; H03K 19/20; H03K 17/687; G11C 19/28
[52] U.S. Cl. ............................. 307/450; 307/443; 307/446; 307/453; 307/572; 307/582; 377/79; 377/117
[58] Field of Search ............ 307/446, 450, 453, 480, 307/481, 571, 572, 582; 377/78, 79, 81, 117 (U.S. only)

[56] References Cited

U.S. PATENT DOCUMENTS

| 4,028,556 | 6/1977 | Cachier et al. | 307/450 |
| 4,034,301 | 7/1977 | Kashio | 377/79 X |
| 4,177,390 | 12/1979 | Cappon | 307/450 |

OTHER PUBLICATIONS

"Optimization of GaAs MESFET Logic Gates with Subnanosecond Propagation Delays", published in Aug. 1979, *IEEE Journal of Solid State Circuits*, vol. SC-14, No. 4, pp. 708-715.
Landers, "MOS Shift Registers"; *The Electronic Engineer;* pp. 59-61; 3/70.
Hargrave, "Commutating and Interfacing with Junction and MOSFETs"; *Electronic Engineering;* pp. 56-59; 12/69.
Eden et al., "The Prospects for Ultrahigh-Speed VLSI GaAs Digital Logic"; IEEE-JSSC; vol. SC-14, No. 2, pp. 221-239; 4/79.
Rocchi et al., "GaAs Binary Frequency Dividers for High Speed Applications up to 10 GHz"; *Electron Letters*, vol. 17, No. 4, pp. 168-169; 2/10/81.

*Primary Examiner*—Larry N. Anagnos
*Attorney, Agent, or Firm*—G. B. Rosenberg; D. W. Collins; A. W. Karambelas

[57] ABSTRACT

The present invention provides a circuit comprising (1) a logic element responsive to data of first and second negative voltage potentials, the logic element having a depletion mode MESFET data input gate, and (2) a depletion mode MESFET transmission gate operatively associated with the data input gate for enabling the selective serial transmission of data therethrough to the logic element in response to clock signals of third and fourth negative voltage potentials, the pinch-off threshold voltage of the data input gate being between approximately the first and second negative voltage potentials, the pinch-off threshold voltage of the transmission gate being between approximately the third and fourth negative voltage potentials, said third negative voltage potential being approximately equal to or more negative than said second negative voltage potential, said first negative voltage potential being more positive than said second negative voltage potential, and said fourth negative voltage potential being more negative than said third negative voltage potential.

11 Claims, 3 Drawing Figures

HIGH-SPEED MESFET CIRCUITS USING DEPLETION MODE MESFET SIGNAL TRANSMISSION GATES

BACKGROUND OF THE INVENTION

1. Field of the Invention

This invention relates to the field of high speed electronic circuits, such as shift registers, and more particularly to a MESFET signal switch and input MESFET logic element circuit.

2. Description of the Prior Art

Metal-semiconductor field-effect transistors (MESFETs) have been known at least since the mid-1960's. Gallium arsenide (GaAs) metal-semiconductor field-effect transistors (MESFETs) are also known and are described in various publications, such as S. Y. Liao, *Microwave Devices and Circuits*, Prentice-Hall, Inc., pp. 288–300.

Shift registers of different types are generally known and described in the literature. Dynamic shift registers frequently consist of a master-slave circuit where both master and slave circuits are identical and consist of a switch and an inverting amplifier, and where the output of the master circuit is the input to the slave circuit. Dynamic shift registers using metal-oxide semiconductor field-effect transistors (MOSFETs) have been demonstrated as shown in R. H. Crawford, MOSFET in Circuit Design, McGraw-Hill, Inc., pp. 107–112.

MOSFET shift registers have produced relatively fast shift registers, but it is desirable to constantly search for still faster shift rates. Shift registers using MOSFETs are slowed in two ways. First, the circuits used to shift information involve several gate delays per shift operation. Second, MOSFETs are, of themselves, slower operating than other electronic switches, such as MESFETs. This is a result of a charge storage phenomenon associated with the gate electrode and SiO$_2$ gate oxide of MOSFET devices. This phenomenon is not encountered with MESFET devices due to the use of a Schottky barrier gate electrode.

Therefore, since MESFETs, MESFET shift registers, and other logic circuits implemented with MESFETs are inherently faster than their MOSFET counterparts, attempts have been made to construct high speed MESFET digital circuits without the use of any MOSFET devices. Certain of these circuits require the use of a transmission or input signal switching gate. Such a gate is typically used to selectively enable the transmission of a signal serially through the gate to a subsequent portion of the circuit. However, standard depletion mode MESFET devices, when used as a transmission gate, normally cannot be maintained in a low impedance state for both "one" and "zero" logic levels without forward biasing the gate of the MESFET. Thus, these devices have not been suitable as input switching devices for MESFET circuits since, under such forward biased conditions, this will inevitably introduce undesirable errors into the intended operation of the circuitry. Consequently, prior art MESFET circuits normally requiring the use of an input switching or transmission gate will use an input MOSFET switching device or the like to alleviate this problem. At the same time, however, the inherent speed limitation of MOSFET devices is imposed on the entire remaining MESFET circuitry with a corresponding loss of the speed advantage of using MESFETs.

SUMMARY OF THE INVENTION

It is a purpose of this invention to overcome the above-described problem of the prior art MESFET transmission gates and to provide an electronic circuit which can be used to build high speed MESFET logic circuits, such as shift registers, having faster data throughput rates.

It is also a purpose of this invention to provide a dynamic shift register circuit using only MESFETs as active devices.

To accomplish these purposes while overcoming most, if not all, of the disadvantages of the prior art described above, the present invention provides an electronic circuit which utilizes an input MESFET switching device as a transmission gate while at the same time overcomes the forward bias current conduction problem previously associated with the use of input MESFET switching devices. In particular, the present invention provides for a circuit comprising (1) a logic element responsive to data of first and second negative voltage potentials, the logic element having a depletion mode MESFET data input gate, and (2) a depletion mode MESFET gate operatively associated with the data input gate for enabling the selective serial transmission of data therethrough to the logic element in response to clock signals of third and fourth negative voltage potentials, the pinch-off threshold voltage potential of the data input gate being between approximately the first and second negative voltage potentials, the pinch-off threshold voltage potential of the transmission gate being between approximately said third and fourth negative voltage potentials, said third negative voltage potential being approximately equal to or more negative than said second negative voltage potential, said first negative voltage potential being more positive than said second negative voltage potential, and said fourth negative voltage potential being more negative than said third negative voltage potential. This novel discovery and development may be further embodied in a NOT logic element whose input is switched by a MESFET switch. The drain-to-source impedance of the MESFET switch is periodically varied by a clock means. An input potential is impressed on the NOT logic element when the clock means periodically turns the MESFET switch on, and the NOT logic element inverts the potential impressed on it. This electronic circuit forms the basic building block of shift register circuits having shift rates of up to 10 gigahertz.

DETAILED DESCRIPTION OF THE INVENTION

Figure 1:
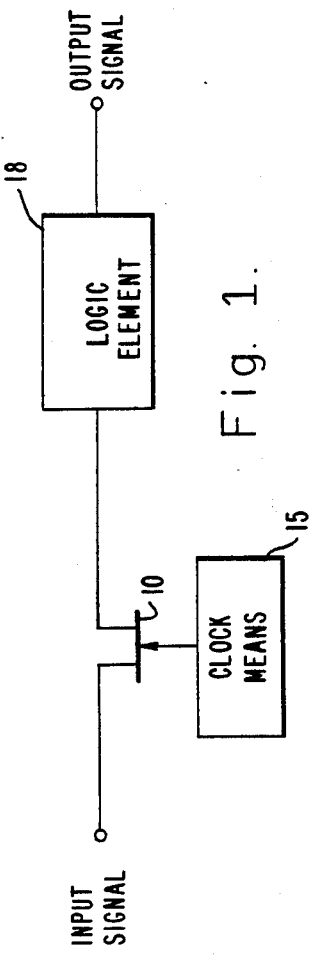
FIG. 1 is a block diagram of an electronic circuit according to the preferred embodiment of the present invention.

The present invention, as illustrated in FIG. 1, provides a MESFET gate 10 connected to a logic element 18 having at least a MESFET input logic gate thereof. The input switch gate 10 permits the serial transmission of an input signal therethrough to be selectively enabled in response to a signal applied to its gate electrode as provided by the clock means 15.

As explained above, the particular difficulty encountered in using depletion mode MESFET transmission gates, to which the present invention pertains, is that the gate 10 will fail to operate as intended when certain, often encountered combinations of input and clock signal potentials are present. In particular, the gate may become improperly biased such that the gate simply fails to switch or the gate electrode thereof becomes forward current conducting. In this latter case, the clock signal will directly interfere with the input signal, resulting in the transmission of incorrect input signal values.

The present invention overcomes these difficulties by providing for the proper selection of the operating characteristics and conditions of the depletion mode MESFET input switch gate 10 with regard to those of the depletion mode MESFET input logic gate of the logic element 18. As a depletion mode MESFET device, the input logic gate of the logic element 18 will operate from a data signal having negative voltage potentials relative to a reference or ground potential. In order for the input logic gate to switch impedance states in response to the applied data, the pinch-off threshold voltage of the logic gate must be negative and approximately at or above the more negative of the data logic levels.

The operating conditions of the MESFET input switch gate 10 are selected to preclude the possibility of forward biasing the gate electrode of the switch gate 10. This is accomplished in the present invention by stipulating that the voltage potential of the clock signal applied to the switch gate 10 gate electrode is never positive with respect to the data potential present at the switch gate 10. Thus, the clock signal voltage potential range is selected to be at least as negative as the more negative of the data logic levels. In view of this, the operating characteristics of the input switch gate 10 are selectively adjusted so as to place its pinch-off threshold voltage within the clock signal voltage potential range and approximately at or above the more negative limit thereof.

These operating characteristics and conditions are best further explained in conjunction with the description of an exemplary embodiment of the present invention.

Figure 2:
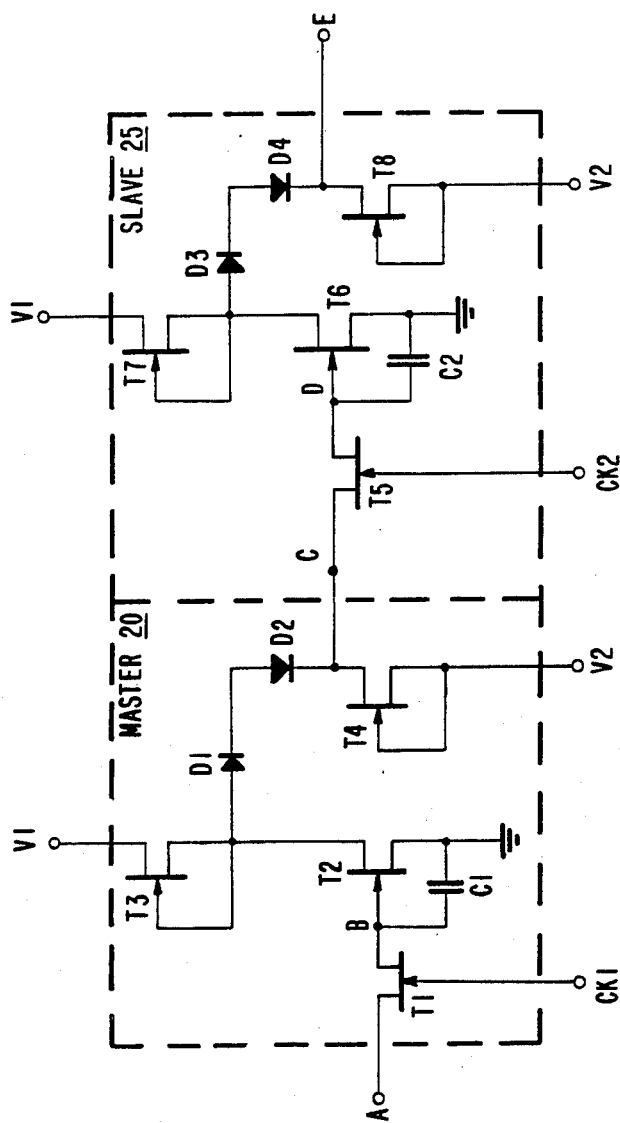
FIG. 2 is a circuit diagram of an exemplary shift register embodiment of the present invention.

FIG. 2 shows the circuit diagram of one stage of a shift register according to the present invention. The shift register stage comprises a master circuit 20 and a slave circuit 25, each enclosed by dashed lines. The output of the master circuit 20 is connected to the input of the slave circuit 25 at point C. Each circuit 20 and 25 comprises both a clocked switch T1, T5 and an inverter T2, T3, T4 and T6, T7, T8, respectively. The input signal to each circuit 20, 25 is connected to the respective switches T1, T5. The output of the switches T1, T5 are connected to their respective inverters T2, T3, T4 and T6, T7, T8 and the output of each of the inverters are connected to the next successive circuit, as generally shown in FIG. 2 and described in more detail below.

More particularly, the input to the master circuit 20, at node A, is connected to the drain of a first MESFET T1. The gate of the first MESFET T1 is connected to a first clock signal Ck1, which typically oscillates between voltage levels of $-1$ volt and $-3$ volts. The source of the first MESFET T1 is connected at a point B to the gate of a second MESFET T2, and through a first capacitor C1 to ground. The first MESFET T1 serves as the switch for the master circuit 20. The second MESFET T2 is the input logic gate of the inverter logic element that forms the remainder of the master circuit 20.

The source of the second MESFET T2 is connected to ground. The drain of the second MESFET T2 is connected to the gate and the source of a third MESFET T3. The drain of the third MESFET T3 is connected to a source of DC potential $V_1$ typically supplying 1.5 volts. The drain of the second MESFET T2 is also connected to the anode of a first diode D1. The cathode of the first diode D1 is connected to the anode of a second diode D2.

A source of DC potential $V_2$, typically supplying $-3$ volts, is connected to the gate and the source of a fourth MESFET T4. The drain of the fourth MESFET T4 is connected to the cathode of the second diode D2. The cathode of diode D2 represents the output of master circuit 20 and is connected to the slave circuit 25 at point C.

The second, third, and fourth MESFETs T2, T3, and T4, along with diodes D1 and D2, and capacitor C1 all comprise the inverter logic element of master circuit 20. The function of the inverter is to invert the logic state of the signal at point B, and can be termed a NOT logic element.

The slave circuit 25 is an identical duplicate of the master circuit 20, except that the gate of the fifth MESFET T5 is connected to a second clock signal Ck2 which oscillates at the same frequency, but 180 degrees out of phase with the first clock signal Ck1. The sixth, seventh, and eighth MESFETs T6, T7, and T8, along with the third and fourth diodes D3 and D4, and the second capacitor C2 comprise the inverter logic element of the slave circuit 25.

The two switching MESFETs T1 and T5 have either a higher donor ion density or a thicker conducting channel than the inverter MESFETs. This may be accomplished by either selective ion implantation or reduced gate recess etching. This difference in fabrication gives each switching MESFET T1 and T5 a more negative pinch-off voltage, preferably of $-2$ volts compared to $-1$ volt for other MESFET devices, and provides each switching MESFET T1 and T5 with a high current drive capability for charging their respective capacitors C1 and C2 without being driven into a high impedance (saturated) state.

Figure 3:
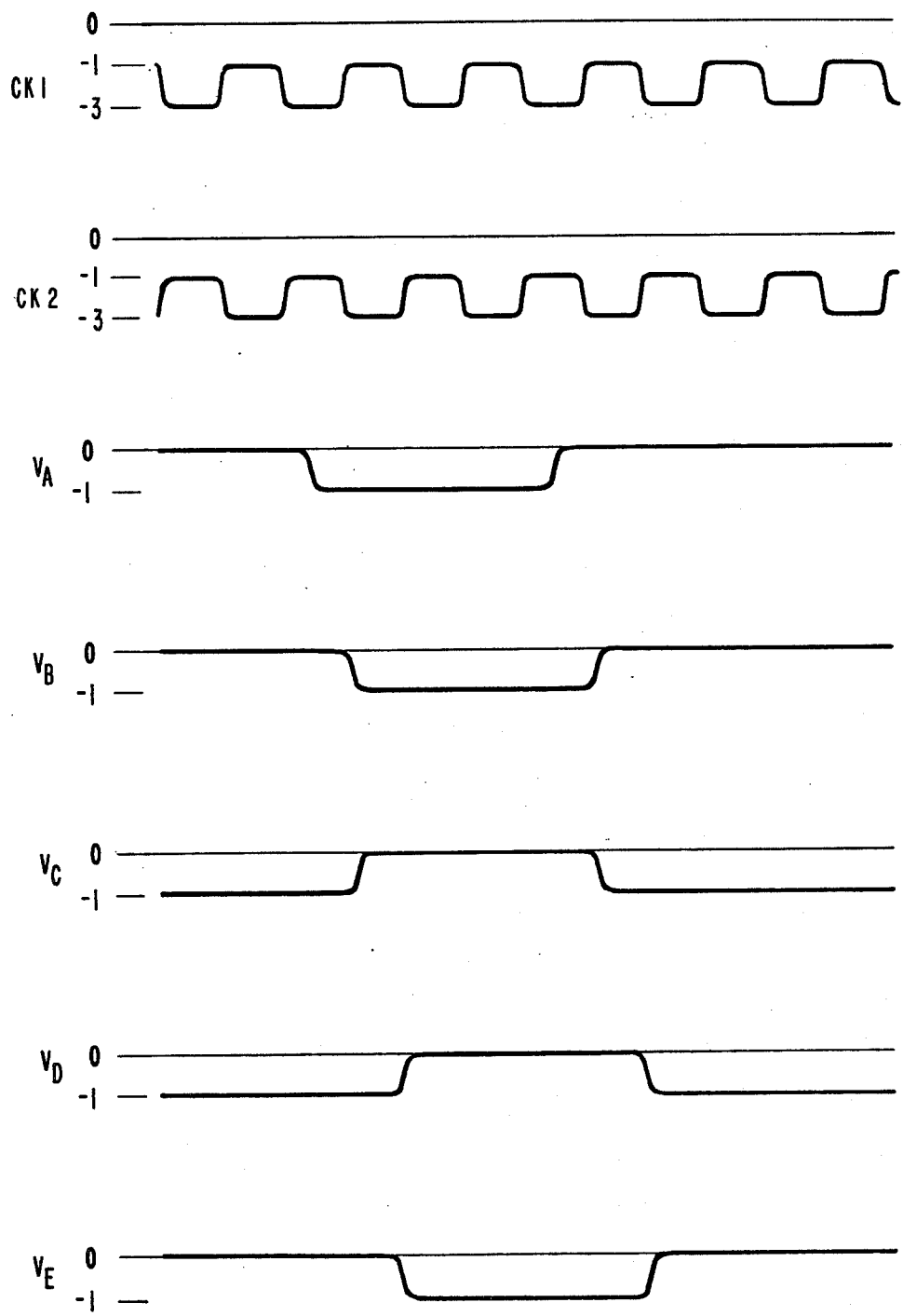
FIG. 3 is a timing diagram for the shift register shown in FIG. 2.

The operation of the shift register stage can be described by referring to FIG. 3, which shows the waveforms of clock signals Ck1 and Ck2, and the waveforms of the signal present at node point A from the preceding shift register stage or from a signal generator (not shown). The output signal $V_E$, provided at node E is fed to the next stage of the shift register.

If $V_A$ and $V_B$ are originally at 0 volts each, then $V_C$ is at $-1$ volt, since that is the logic state that is the inverse of $V_B$. $V_D$ is at the same potential as $V_C$ because Ck2 will have driven T5 "on" during one of its past cycles, thereby substantially equalizing the potentials at $V_C$ and $V_D$. $V_E$ will then be the inverse of $V_D$, or 0 volts. Continuing cycles of both clocks will not cause any change of state in either of switching MESFETs T1 or T5, because $V_A = V_B$ and $V_C = V_D$.

At some time, the potential of $V_A$ will go from 0 to $-1$ volt, as shown in FIG. 3, because of a $-1$ volt DC signal fed to node point A. If, at that time, Ck1 = $-3$ volts, then T1 will be biased "off" and $V_B$ will remain unchanged. When Ck1 changes state to $-1$ volt, T1 will be biased "on" and $V_B$ will change to −1 volt. The inverter of the master circuit 20 will cause $V_C$ to change to 0 volts. Therefore, shortly after Ck1 becomes −1 volts, $V_C$ will be at 0 volts.

While Ck1 remains at −1 volts, $V_D$ will remain unchanged, because Ck2 will be at −3 volts and T5 will remain biased "off". However, when Ck1 changes to −3 volts, Ck2 will change to −1 volt, biasing T5 "on" and causing $V_D$ to change to 0 volts. The inverter of the slave circuit 25 will cause $V_E$ to change to −1 volts, the inverse of $V_D$. Since $V_A = V_B$ and $V_C = V_D$ again, no further changes will occur during successive clock cycles.

If the input signal returns to 0 volts when Ck1 = −3 volts, then $V_B$ will remain −1 volt until Ck1 changes to −1 volt. At that time, T1 would be biased "on" causing $V_B$ to become 0 volts and changing $V_C$ to −1 volt. $V_D$ would remain at 0 volts until Ck2 became −1 volt and T5 turned "on". $V_D$ would change to −1 volt and cause $V_E$ to return to 0 volts. No further shifts would occur until $V_A$ changed states, since $V_A$ would equal $V_B$ and $V_C$ would equal $V_D$.

It is readily apparent from the above explanation that the circuit of FIG. 2 performs the normal shift register function of causing the output to assume the logic state of the input and thereafter change states one full clock cycle after a change of state in the input.

The clock frequency of Ck1 and Ck2 has an upper limit determined by the charging time of capacitors C1 and C2, and a lower limit determined by capacitor leakage through the switch MESFETs T1 and T5 when they are "off", and by the small leakage current through the MESFETs T2 and T6. When realized as an integrated circuit the shift register described above will propagate information with only two gate delays per shift operation.

It is understood that the above-described embodiments are merely illustrative of the many possible specific embodiments which may utilize the principles of this invention. Numerous and varied other arrangements can be devised in accordance with these principles by those skilled in this art without departing from the scope of the present invention as established by the appended claims.

What is claimed is:

1. An electronic circuit biased about a reference voltage and comprising:
   (a) a logic element responsive to a data input signal including a high logic level of a first voltage and a low logic level of a second voltage;
   (b) a clock means for supplying an oscillating electric potential clock waveform having a minimum and a maximum voltage with respect to the reference voltage, wherein:
      (i) the absolute value of the clock waveform's minimum voltage is greater than the absolute value of the clock waveform's maximum voltage, and
      (ii) the clock waveform's maximum voltage is approximately equal to or more negative than both the first and second voltages of the logic element; and
   (c) a metal-semiconductor field-effect transistor (MESFET) switch whose source-to-drain impedance is controlled by the voltage level of the clock waveform applied at its gate electrode and having its source connected to the input of the logic element and its drain receiving the data input signal, and wherein the switch MESFET's pinch-off voltage is more positive than the clock waveform's minimum voltage and more negative than the clock waveform's maximum voltage.

2. The electronic circuit of claim 1 wherein the MESFET switch is a gallium arsenide MESFET and the electronic circuit is realized as an integrated circuit.

3. The electronic circuit of claim 1 wherein the clock means generates an oscillating electric potential clock waveform generally in the form of a square wave.

4. The electronic circuit of claim 3 wherein the clock means connected to the gate of the MESFET switch periodically turns the MESFET switch on and off.

5. The electronic circuit of claim 4 wherein the clock means oscillates between −1 and −3 volts, wherein the high logic level is 0 volts and the low logic level is −1 volt, and wherein the pinch-off voltage of the MESFET switch is approximately −2 volts.

6. The electronic circuit of claims 2, 3, 4, or 5 wherein the logic element comprises:
   (a) a first MESFET having its drain connected to a source of electric potential and its source electrode connected to its gate;
   (b) a second MESFET having its drain connected to the source electrode of the first MESFET, and its source electrode connected to ground;
   (c) a third MESFET having its gate and its source electrode connected to a source of electric potential having a negative polarity; and
   (d) plural diodes connected in series, with the anode of the first diode connected to the drain of the second MESFET and the cathode of the last diode connected to the drain of the third MESFET;
   wherein the gate of the second MESFET is the input electrode of the logic element and the drain of the third MESFET is the output electrode of the logic element.

7. The electronic circuit of claims 1 or 5 further comprising an identical second electronic circuit wherein the output of the logic element of the first electronic circuit is connected to the drain electrode of the MESFET switch of the second electronic circuit, and wherein the drain-to-source impedance of the MESFET switch of the second electronic circuit is varied at the same frequency as that of the first electronic circuit by a periodic clock signal applied at its gate electrode which is 180 degrees out of phase therewith.

8. A circuit comprising:
   (a) a logic element responsive to data of first and second negative voltage potentials, said logic element having a depletion mode MESFET data input gate; and
   (b) a depletion mode MESFET transmission gate operatively associated with said data input gate for enabling the selective serial transmission of data therethrough to said logic element in response to clock signals of third and fourth negative voltage potentials, the pinch-off threshold voltage potential of said data input gate being between approximately said first and second negative voltage potentials, the pinch-off threshold voltage potential of said transmission gate being between approximately said third and fourth negative voltage potentials, said third negative voltage potential being approximately equal to or more negative than said second negative voltage potential, said first negative voltage potential being more positive than said second negative voltage potential, and said fourth negative voltage potential being more negative than said third negative voltage potential.

9. The circuit of claim 8 further characterized as being fabricated on a monolithic substrate.

10. The circuit of claim 9 wherein said first and second negative voltage potentials range from approximately 0 to −1 volts and said second and third negative voltage potentials range from approximately −1 to −3 volts.

11. The circuit of claim 8 wherein said MESFET data input gate and said MESFET transmission gate are both GaAs devices.

* * * * *